United States Patent [11] 3,577,037

[72] Inventors Americo R. Di Pietro
Katonah, N.Y.;
Rudolf E. Thun, Carlisle, Mass.
[21] Appl. No. 742,886
[22] Filed July 5, 1968
[45] Patented May 4, 1971
[73] Assignee International Business Machines Corporation
Armonk, N.Y.

[54] DIFFUSED ELECTRICAL CONNECTOR APPARATUS AND METHOD OF MAKING SAME
1 Claim, 13 Drawing Figs.

[52] U.S. Cl. .......... 317/101, 317/235
[51] Int. Cl. .......... H01l 19/00
[50] Field of Search .......... 317/101 (A), 235, 22; 29/576, 577, 578, 579

[56] References Cited
UNITED STATES PATENTS
3,343,256 9/1967 Smith, et al. .......... 29/578
3,150,299 11/1964 Noyce .......... 317/101A(UX)
3,256,465 6/1966 Weissenstern et al. .......... 317/101A(UX)
3,388,301 6/1968 James .......... 317/101A(UX)

OTHER REFERENCES
" Piggy-Back Mounting Would Increase Microcircuit Packaging Density," SOLID STATE TECHNOLOGY, April, 1969, Page 8. (Copy 317— 101A)

*Primary Examiner*—David Smith, Jr.
*Attorneys*—Hanifin & Jancin and Norman R. Bardales

ABSTRACT: An electrical connector having first and second metallization conductive patterns disposed on two faces, respectively, of a semiconductor substrate and one or more diffused interconnections within the substrate for connecting the conductive patterns in a predetermined manner. Circuit apparatus having at least two semiconductor substrates, each of which has a plurality of integrated circuits of the monolithic type, and each of which is mounted on a mutually exclusive face of the aforementioned diffused electrical connector.

INVENTORS
AMERICO R. DI PIETRO
RUDOLF E. THUN

BY

ATTORNEY

DIFFUSED ELECTRICAL CONNECTOR APPARATUS AND METHOD OF MAKING SAME

BACKGROUND OF THE INVENTION

This invention relates to electrical connectors and more particularly to electrical connectors for connecting integrated circuits.

In the manufacture of integrated circuit devices and more particularly in the manufacture of large scale integrated circuit devices, it is desirable to optimize cross-connections between the integrated circuits of the substrate of an integrated circuit member, also referred to in the art as a chip, and those of another chip, as well as the cross-connections between the integrated circuit elements of the same chip. Heretofore in the past, one solution to the cross-connection problem has been the use of plural layers of conductive metallization patterns separated by suitable insulating layers and all disposed in stacked relationship on one surface of the chip. Alternatively, or in combination with the foregoing, certain prior art cross-connections were also made by providing a layer of diffused under-crossings in the substrate of the chip in a manner well known to those skilled in the art. In order to provide electrical connection between the integrated circuits of one chip with those of another chip, a printed circuit conductor board which had an inert substrate with a metallization conductive pattern disposed on one of its outer surfaces was utilized. Thus, the individual circuit chips were located in a suitable housing, e.g. a flat-pack package, which were mounted in a coplanar relationship on one, i.e. the same, side of the connector printed circuit conductor board. In some cases, the connector board had conductive metallization patterns disposed on both of its outer surfaces and an interconnection between its metallization patterns was provided by one or more conductive members such as a pin which was imbedded in the substrate or by one or more plated-thru apertures known in the art as via holes. This allowed the mounting of integrated circuit chip packages on both sides of the board.

There are many problems associated with making the prior art cross-connections. For example, in the case where plural layers of metallization patterns were employed on the same chip, each step in the process which added a metallization layer and its associated insulation layer adversely affected the yield of the number of good circuits of the chip. For the same reason, in the case where the aforementioned diffused under-crossings were employed, each process step associated with their making also adversely affected the yield of the number of good circuits in the chip. Moreover, with the advent of large scale integration where the number of circuits per substrate of a chip is in the order of magnitude of from 100 to 1,000 there is a finite limitation on the number of metallization layers and/or diffused under-crossing layers which can be provided for one chip.

In the case of the connector printed circuit conductor boards of the prior art, the processes associated with their manufacture are not compatible with the processes for making integrated circuit chips of the monolithic type. For example, the conductor boards of the prior art are generally made of an inert substrate, e.g. plastic, ceramic, etc., upon which the metallization conductive pattern(s) are formed. Thus, the manufacturer is required to provide two different types of materials for making the integrated circuit chips and the conductor boards, to wit: a semiconductor material and an inert material, respectively. Moreover, when the printed circuit connector boards of the prior art employed via holes of the aforedescribed type, the plating process associated with making the via holes was not compatible to the semiconductor processes such as solid state diffusion and epitaxial growth associated with the monolithic technique for making this type of integrated circuit chip. Furthermore, the making of the interconnection via holes by plating disposition has several disadvantages. For example, as is well known to those skilled in the art, plating is an additive process and thus must be carefully controlled so that the plating material does not completely fill the cavity or space formed by the inner walls of the apertures of the via hole being formed. Another problem is that of providing reliable adherence of the plating material to the inner walls of the cavity and which is adversely affected by such things, for example, as differences between the thermal expansion coefficients of the ceramic substrate and the plating material, etc. Thus, in the past the manufacturer was required to provide different tooling means for implementing the different processes for making the via interconnections of the printed circuit conductor boards and for making the monolithic integrated circuit chip types. For the same reasons, when an imbedded conductive member such as a pin was employed for making the interconnection between the metallization patterns of the printed circuit conductor boards of the prior art, the reliability of the connection or adherence of the pin to the inert base was also adversely affected due to such things as differences in their coefficients of expansion. The resultant mechanical and/or electrical failure adversely affected the performance or operation of the integrated circuits and systems of which it was a part. Here too the process for imbedding the pins in the substrate was not compatible to the process for making the integrated circuits of the monolithic types and the manufacturer was required to provide different tooling means for implementing the process of fabricating the pin interconnections of the printed circuit connector boards and implementing the process for making the monolithic integrated circuit chip types.

It can be readily seen from the foregoing that the prior art cross-connection structures and processes were different from the structure and processes associated with the manufacture of integrated circuits of the monolithic type and particularly those of the large scale integrated varieties.

SUMMARY OF THE INVENTION

It is an object of this invention to provide an electrical connector for integrated circuits.

It is another object of this invention to provide an electrical connector of the aforementioned kind which is amenable to fabrication by monolithic techniques compatible to those employed for making integrated circuits of the monolithic type.

Another object of this invention is to provide an electrical connector which utilizes a semiconductor substrate having diffused conductive interconnections between the metallization patterns disposed on its outer surfaces.

Still another object of this invention is to provide an aforementioned electrical connector which simplifies the inter and/or intraconnections of an integrated circuit apparatus.

It is still another object of this invention to provide an integrated circuit apparatus structure employing the aforementioned electrical connector and at least one discrete integrated circuit member of the monolithic type mounted on each side of the connector.

Still another object of this invention is to provide a method for making an electrical connector as a monolithic structure.

Other objects of this invention are to provide electrical connector apparatus and a method for making the same, and/or an electrical circuit apparatus combination amenable to large scale integration fabrication.

According to one aspect of the invention, there is provided an electrical connector apparatus having a semiconductor substrate with first and second surfaces. The substrate has a first region of a predetermined conductivity type disposed therethrough between the two surfaces. At least one diffused second region of opposite conductivity type is provided which is formed within the first region and is disposed therethrough between the two surfaces. Insulator means are disposed on the first and second surfaces and provided with first and second apertures therein for exposing the first and second surfaces, respectively, at the diffused second region. A first metallization conductive pattern, which is adjacent to the first surface, is disposed on the insulator means and a second metallization conductive pattern, which is adjacent to the second surface, is disposed on the insulator means. The first and second metallization conductive patterns are further provided with preselected first and second parts, respectively, that are in intimate contacting relationship with the first and second surfaces, respectively, which are exposed at the diffused second region. The diffused second region thus provides an electrical interconnection between the first and second patterns.

The foregoing and other objects, features and advantages of the invention will be apparent from the more particular description of the preferred embodiments of the invention as illustrated in the accompanying drawing.

BRIEF DESCRIPTION OF THE DRAWING

In the FIGS., like elements are designated with similar reference numerals.

DESCRIPTION OF THE PREFERRED EMBODIMENTS

Figure 2:
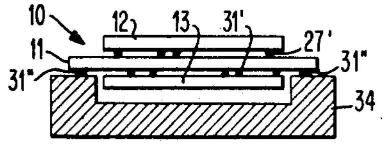
FIG. 2 is a cross-sectional view of the circuit apparatus of FIG. 1 taken along the line 2–2 thereof.
Figure 1:
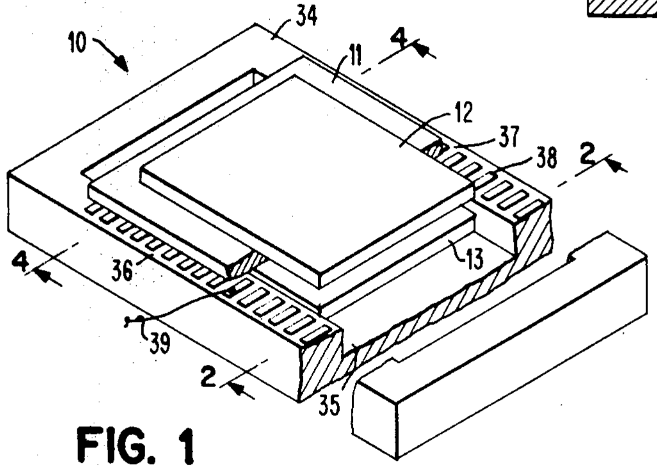
FIG. 1 is a perspective view, partially broken away, illustrating an embodiment of the integrated circuit apparatus of the present invention.
Figure 3:
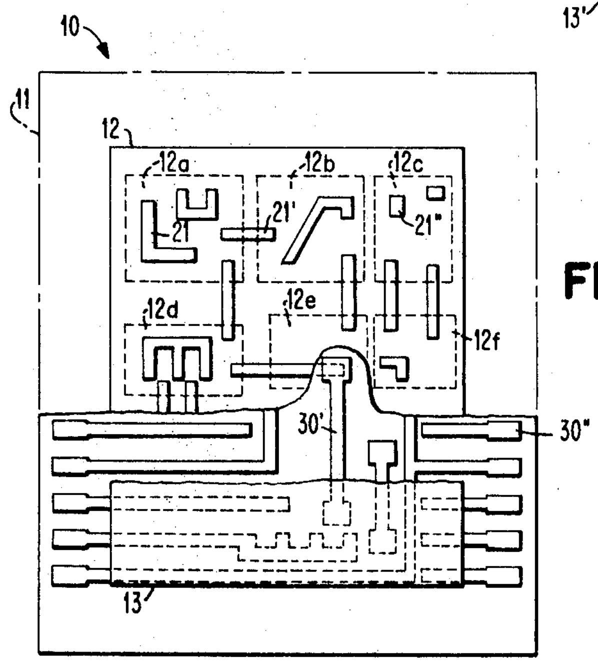
FIG. 3 is a enlarged bottom view, partially broken away, of the circuit apparatus shown in FIG. 1.

Referring to FIGS. 1—3, there is illustrated an embodiment of the integrated circuit apparatus, generally indicated by the reference numeral 10, of the present invention. Also illustrated therein is an embodiment of the electrical connector 11 of the present invention. Member 11 is part of the circuit apparatus 10 and is described in greater detail hereinafter. The circuit apparatus 10 also includes at least one integrated circuit member or chip mounted on each of the opposing flat planar sides of the connector 11. By way of example, the circuit apparatus 10 is shown in the drawing as having two integrated circuit members 12 and 13 symmetrically mounted on the opposite sides, respectively, of member 11.

Figure 4:
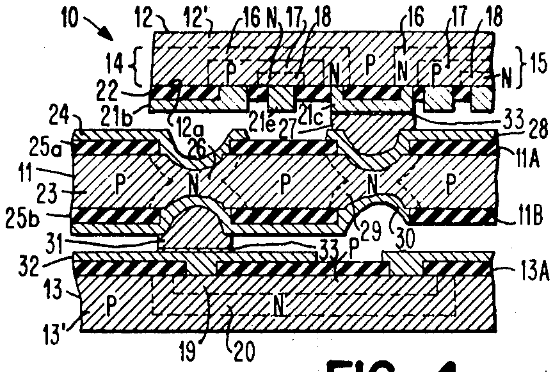
FIG. 4 is an enlarged partial cross-sectional view of a typical section of the circuit apparatus of FIG. 1 taken along the line 4–4 thereof.

Each of the integrated circuit chips has a plurality of integrated circuits of the monolithic type. In FIG. 3, the members 11 and 13 are partially broken away to illustrate some of the integrated circuits 12*a*—12*f* of member 12, shown for sake of clarity therein as dash line rectangular blocks. Each of the integrated circuit members 12, 13 is comprised of a semiconductor substrate, e.g. substrates 12′, 13′, of silicon or the like, c.f. FIG. 4. The integrated circuits are formed by a technique known in the art as a monolithic technique which involves inter alia the use of semiconductor processes such as solid-state diffusion and epitaxial growth and which technique allows the simultaneous fabrication of all the circuit elements. Each of the circuits of the members, e.g., members 12, 13, is designed to perform a certain function in the electronic system or subsystem of which it ultimately may become a part. As is well known to those skilled in the art, there is provided for each circuit function required by the system or subsystem a group of one or more circuits, each of which is designed to provide the desired function. One or more of the different groups are located in the same substrate.

By way of example, in the particular section of the member 12 shown in FIG. 4, there is partially illustrated a pair of adjacent active circuit elements, to wit: transistors, generally indicated by the reference numerals 14, 15, which are formed in the substrate 12′ and each of which has collector, base, and emitter regions 16, 17, and 18, respectively. Transistors 14, 15 may be circuit elements of the same integrated circuit or two different integrated circuits of the member 12 depending upon the particular system design of which they are a part. In the preferred embodiment illustrated in FIG. 4, the substrate 12′ is shown as being of the P conductivity type and accordingly the transistors 14 and 15 are of the NPN conductivity type, the regions 16, 17 and 18 being formed therein by the aforementioned monolithic technique. Likewise, in the particular section of the member 13 shown in FIG. 4, there is illustrated a passive circuit element, e.g. resistor 19, of one of its integrated circuits. By way of example, substrate 13′ is illustrated as being of the P conductivity type. Accordingly, the resistor 19 in this example is of the P type and is isolated from the substrate 13′ by an isolation region 20 which is of the N types. It should be understood that each of the members 12, 13 have active and/or passive elements as well as different types of these elements such as, for example, diodes, capacitors, and inductors. The manner of fabricating circuit elements in an integrated circuit of the monolithic type is well known to those skilled in the art and, for example, is taught in the copending application entitled, "Method for Making Integrated Circuit Apparatus" of Frederick F. Jenny and Rudolf E. Thun, coinventor herein, filed Jan. 19, 1968, application Ser. No. 699,095 and which is assigned to the present Assignee herein and is also taught in the reference, "Integrated Circuits: Design Principles and Fabrication," Raymond M. Warner, Jr. and James N. Fordemwalt—McGraw-Hill, 1965, cited in the aforementioned application.

On each of the outer surfaces 12A and 13A of the substrates 12′ and 13′, respectively, there is formed a metallization pattern such as the metallization pattern of flat conductors, e.g. conductor 21, formed on the outer surface 12A of substrate 12′, c.f. FIG. 3. The metallization pattern provides the intraconnection between predetermined elements of the integrated circuits of the particular member 12, 13 with which it is associated. Thus, as shown in FIG. 3, the conductor 21′, for example, of the metallization pattern of member 12 provides an intraconnection between circuit elements, not shown, of the integrated circuits 12*a* and 12*b* of member 12 and the conductor 21 provides an intraconnection between certain of the circuit elements, not shown of the circuit 12*a*. The metallization patterns include certain conductors which are in contact with the collector, base, and emitter regions, respectively, of the transistors of the integrated circuit member of which the particular pattern is a part. Thus, as shown in greater detail in FIG. 4, conductors 21*c*, 21*b*, and 21*e* of the metallization pattern of member 12 are connected, respectively, to the collector 16, base region 17, and emitter region 18 of transistor 14. Each integrated circuit member has an insulating layer of silicon dioxide or the like provided between its metallization pattern and the outer surface of its substrate, e.g. insulating layer 22 provided on outer surface 12A of a substrate 12′. The insulating layer is located beneath those parts of the conductive pattern where it is desired that these parts not make electrical contact with the areas of the substrate lying beneath. The manner of producing the insulating layer and conductive pattern is well known to those skilled in the art and is taught, for example, in the aforementioned copending application and reference cited therein.

In accordance with the principles of the present invention, the connector 11 has a semiconductor substrate 23 of silicon or the like and is, for example, of the P conductivity-type. On the outer surfaces 11A, and 11B of substrate 23 there are provided predetermined conductive metallization patterns, each of which has a plurality of flat conductors, e.g. conductor 24 of the metallization pattern located on upper surface 11A. Again, under those parts of the conductors of each of the metallization patterns where it is desired that these parts characteristic make electrical contact with the areas of the substrate 23 lying beneath it there is provided electrical insulator means, e.g. layers 25*a*, 25*b* of an electrical insulator such as silicon dioxide or the like. The other parts of the conductors of the metallization patterns are in intimate contacting relationship with the substrate surface 11A or 11B as the case may be. In order to provide interconnection between the metallization patterns of substrate 23 one or more diffused interconnection, e.g. diffused interconnection 26, are provided in the substrate 23, in a manner hereinafter described. The resistivity characteristic of each of these interconnections is selected by appropriate control of the diffusion process in a manner well known to those skilled in the art and in the preferred embodiments is selected to have a low resistivity characteristic. The diffused regions or interconnections, e.g. interconnection 26, are of opposite conductivity type, e.g. N conductivity type, to the nondiffused region of substrate 23. As a result, electrical isolation is provided between the diffused interconnections or feedthroughs 26. The diffused interconnection pattern of the member 11 and the metallization patterns member 11—13 are judiciously selected to minimize the number of cross-connections between the integrated circuits of the members 12, 13. By way of example as shown in greater detail in FIG. 4, the collector regions 16 of transistors 14 and 15 are illustrated as being commonly connected via the conductor 21*c* of the metallization pattern of member 12 through the solder reflow connection member 27 to the conductor 28 of the upper metallization pattern of substrate 23. In turn, the conductor 28 is connected by the diffused interconnection 29 to the conductor 30 of the lower metallization pattern of member 11. Conductor 30 is connected to the solder reflow member 31 which interconnects the conductor 32 of the metallization pattern of member 13, conductor 32 in turn being connected inter alia to one end of the P resistor 19 of member 13.

In the embodiment illustrated in FIGS.1—4, the means for connecting the conductive means or metallization patterns of the integrated circuit members 12, 13 to the metallization patterns of the connector 11 are preferably solder reflow members, such as members 27, 27′, 31, 31′, for example. In practice, the solder reflow members would be initially positioned in the form of solder pellets or solder coated metallic members between the integrated circuit member and the connector 11 at the desired locations and thereafter placed in a thermal environment so as to effectuate a solder reflow joint between the metallization patterns of the particular integrated circuit member and the connector 11. The solder reflow joint would thus provide the electrical and mechanical connection of the members 12 and 13 to the connector 11. As shown in greater detail in FIG. 4, the metallization patterns at the desired points of contact, e.g. conductors 21, 21′, 21″ of member 12, may be treated with a suitable bonding material such as a bonding cement, c.f. cement layer 33, so as to maintain the pellet in a fixed position prior to effectuating the solder reflow bonding process.

Member 34 of FIG. 1 is a ceramic substrate having a hollow, U-shaped recess 35. On the upper lateral edges 36, 37 of the member 34 there is provided a metallization pattern shown as a plurality of parallel flat conductors, e.g. conductor 38. These conductors are adapted to be in register with a plurality of conductors, e.g. conductor 30″ of FIG. 3 which are part of the lower metallization pattern of connector 11. Circuit apparatus 10 is adapted to be connected to preselected ones of the conductors, e.g. conductors 38, via suitable solder reflow members, e.g. members 31″, after the members 12 and 13 have been solder reflow connected to the member 11. The members, e.g. 31″ are selected to have a lower melting point that that of the solder reflow members, e.g. members 27, 27′, 31, 31′ which are used to interconnect the members 10 and 12 with member 11. Members 31″ thus provide mechanical and electrical interconnection of the assembled circuit apparatus 10 to the metallization pattern of the member 34. External electrical connection of the conductors, e.g. conductor 38, of the member 34 may be effectuated by any suitable connector means such as a compatible electrical receptacle, not shown, and/or such as for example by flying leads such as the conductor 39, partially shown. Member 34 may be elongated along its edges 36, 37 so as to accommodate additional circuit apparatus, not shown, similar to the circuit apparatus 10. Alternatively, the connector 11 may be elongated in the same direction as the elongated edges 36, 37 of member 34 so that one or more additional integrated circuit members, not shown, may be disposed on each of the sides of member 11, the lower additional circuit members being located within the U-shaped recess 35.

Figure 5A:
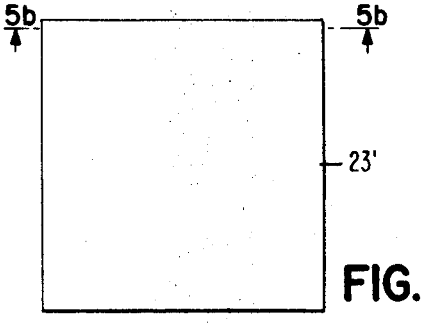
FIGS. 5*a* and 6*a* are schematic views of the substrate of the electrical connector of the present invention at different stages of its fabrication in accordance with the preferred method embodiment of the present invention, FIG. 6*a* being partially broken away for the sake of clarity.
Figure 5B:
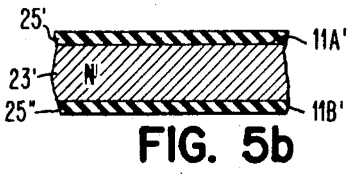
FIGS. 5*b* and 6*b* are enlarged partial cross-sectional views taken along the lines 5*b*–5*b* and 6*b*–6*b* of FIGS. 5*a* and 6*a* respectively.
Figure 6A:
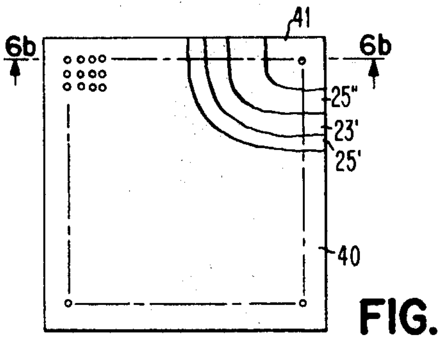
Figure 6B:
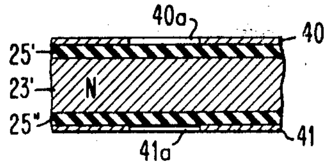

Referring now to FIGS. 5*a*—5*b* to 8*a*—8*b*, a preferred embodiment of the method the present invention for making a connector 11′ is now described. A semiconductor substrate 23′ of silicon or the like of a predetermined conductivity type, e.g. type N is first provided, c.f. FIGS. 5*a*, 5*b*. Next, there is deposited on the surfaces 11A′ and 11B′ insulating layers 25′ and 24″, respectively, Etch resistant masks 40, 41 such as positive or negative photo resists are then applied in a manner well-known to those skilled in the art to the tops of the oxide layers 25′, 25″, respectively, c.f. FIGS. 6*a*, 6*b* The masks 40, 41 have registered compatible aperture patterns of one or more pairs of aligned apertures 40*a*, 41*a*, c.f. FIG. 6*b*. The aperture patterns of the masks 40, 41 may be symmetrically arranged such as the rectangular matrix partially shown in FIG. 6*a* or may be asymmetrically arranged. After exposure, polymerization and dissolution of the appropriate areas of the masks, the assembly of FIG. 6*b* is next etched so that the exposed parts of the layers 25′, 25″ and a predetermined quantity of the substrate 23′ therebetween are removed. For example, first the exposed parts of the oxide layers 25′ would be etched by an etchant such as a solution of 10 percent hydrofluoric acid and 90 percent water; and next the substrate 23′ would be etched by another etchant such as a mixture of hydrofluoric, nitric, and acetic acids for a silicone substrate. This reduction of the cross-sectional area of the substrate 23′ causes a concommitant reduction in the subsequent diffusion process step utilized to form the diffused interconnection. After the completion of the etching, the masks 40, 41 are removed by a suitable solvent or oxidizing acid in a manner well known to those skilled in the art. It should be understood, however, that in certain cases, etching of the substrate 23′ need not be performed. In such cases only the exposed areas of the oxide layers are etched away whereupon the masks 40, 41 are removed and then the hereinafter described diffusion step is performed.

Figure 7A:
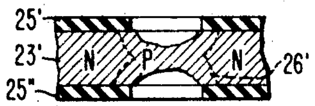
FIGS. 7*a* and 7*b* are enlarged partial cross-sectional views of an embodiment of a diffused interconnection of the electrical connector of the present invention at different stages of its formation.
Figure 8A:
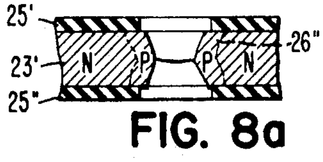
FIGS. 8*a* and 8*b* are enlarged partial cross-sectional views of another embodiment of a diffused interconnection of the electrical connector of the present invention at different stages of its formation.
Figure 7B:
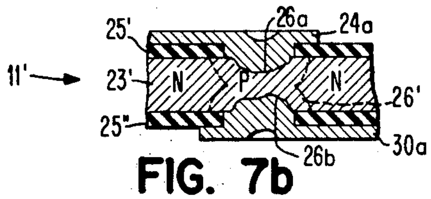
Figure 8B:
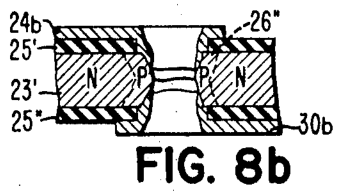

Referring now to FIGS. 7*a*—7*b* and FIGS. 8*b*—8*b* there are shown two preferred embodiments of the diffused interconnection formed in an electrical connector substrate 23′ which has been etched. In FIG. 7*a*, there is shown an embodiment wherein the etchant is not allowed to etch completely through the substrate 23′. As aforementioned, after the etching step is terminated and the masks 40, 41 removed the exposed areas of the substrate 23′ that are not covered by the layers 25′, 25″ are diffused with an opposite conductivity type diffusant, which for the N-type substrate illustrated is a diffusant such as boron. For the P-type substrate an N-type diffusant such as phosphorous may be used as is well known to those skilled in the art. The diffusion takes place on both sides of the substrate through the openings in the layers 25′, 25″. The diffusion progresses from both sides until the diffusion fronts meet such that an integral diffused region 26′ is formed between the substrate surfaces. As a result, the hourglass-shaped diffused region 26′ is formed through the substrate 23′ and between the substrate's upper and lower surfaces. Thereafter, c.f. FIG. 7*b*, the metallization patterns such as the aluminum conductors 24a, 30a are formed in a manner well known to those skilled in the art over the respective oxide layers 25′, 25″. In addition, preselected parts of the metallization patterns are formed in intimate contact with the surfaces, e.g. surfaces 26a, 26b, of preselected diffused regions, e.g. region 26′. Thus, the diffused regions are formed in the substrate 23′ and provide the interconnection between the upper and lower metallization patterns of the member 11′ and more particularly in the case of the diffused interconnection 26′ of FIG. 7b between the conductors 24a and 30a of the member 11′.

In FIGS. 8a—8b there is shown another embodiment wherein the etching takes place completely through the substrate 23′. As before, after the etching process step the masks 40, 41 are removed. Next, the area of the substrate 23′ not covered by the oxide layers 25′, 25″ are exposed to a diffusant, resulting in the lateral walls of the holes formed by the etchant in the substrate 23′ being diffused with an opposite conductivity type, e.g. P-type so as to form the peripheral hourglass-shaped diffused region around the walls of the holes such as the region 26″. Thus, the diffused regions are formed through the substrate 23′ of FIG. 8a between its upper and lower surfaces. Thereafter, the conductors, e.g. 24b, 30b, of the upper and lower preselected metallization patterns of the member 11′ are formed on the oxide layers 25′, 25″ and parts thereof are formed in contact with preselected diffused regions, e.g. region 26″, c.f. FIG. 8b.

In practice, each of the integrated circuit members which are to be mounted to the connector 11 has a metallization pattern, as aforementioned, which provides a predetermined amount of intraconnections between preselected circuit elements of one or more of its integrated circuits. The personality of the metallization patterns of the connector 11 is provided so as to supplement the interconnection between preselected circuit elements of the integrated circuit members to be mounted on one of its sides with preselected circuit elements of the integrated circuit members to be mounted on its other side. Each of the metallization patterns of the connector 11 alone or in combination with the other metallization pattern of member 11 and coacting diffusion interconnections may also be utilized to supplement the intraconnections of the circuits of the one or more integrated circuit members which are to be mounted on the same side of the member 11. As is apparent to those skilled in the art, the connector 11 may be provided with a symmetrical diffused interconnection pattern so as to standardize the production thereof and the personality of its conductive patterns subsequently placed thereon in a preselected configuration which is compatible to the interconnections required between the good circuits of the particular integrated circuit members which are to be mounted to the connector 11. Alternatively, the diffused interconnection pattern and the metallization conductive patterns of the member 11 may be tailored to the interconnections actually required between the good circuits of the integrated circuit members that are to be mounted in the connector 11.

Figure 9:
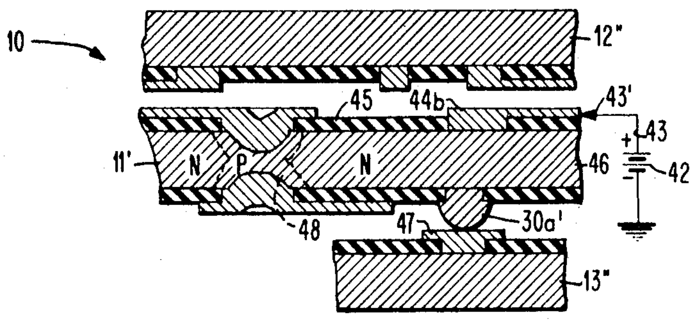
FIG. 9 is an enlarged partial cross-sectional view of an integrated circuit apparatus of the present invention wherein the electrical connector thereof is a supply bus.

In FIG. 9 there is partially shown circuit apparatus 10′ having an interconnecting member 11″ and integrated circuit members 12″, 13″ which are connected to the metallization patterns of member 11′ by suitable means such as, for example, the solder reflow member 30a. The integrated circuit members 12″ and 13″ of apparatus 10″ are of the monolithic type and the member 11″ is similar to the connector 11 previously described. The member 11″ acts as a power bus for connecting the power or bias supply shown schematically by the battery 42 to the circuits of members 12″ and 13″. By way of example, the electrical connection between the connector 11″ and the positive terminal + of the power supply is represented schematically in FIG. 9 by the wire conductor 43 and arrow 43′ which is connected to the flat conductor 44 of the upper metallization pattern of member 11″. The upper insulator layer 45 has an opening through which the conductor 44 is placed in intimate contact with the nondiffused region 46 of the substrate 11′. The nondiffused region 46 is also connected to the solder reflow member 30a. Conductor 47 of the metallization pattern of member 13″ is connected to the member 30a′. Thus, the positive terminal + of the power supply 42 is connected via the connector 11″ to the integrated circuit member 13″ so as to provide a bias supply for the circuits thereof. It is to be understood that the circuits of the member 13″ would be grounded by an appropriate conductor, not shown, provided in the metallization pattern thereof so as to complete the energizing circuit path. A similar interconnection, not shown, between the upper metallization pattern of member 11″ and the metallization pattern of member 12″ is provided to energize the circuits of member 12″. By way of example, the nondifussed region 46 of the substrate 11 is shown in FIG. 9 as being of N conductivity-type, the diffused region 48 of the diffused interconnection illustrated therein being of the opposite conductivity-type i.e. P-type.

It should be understood that while the circuit members 12, 13 are each shown with one layer of metallization patterns in the preferred embodiments that the invention could be practiced where the circuit members have plural stacked metallization layers and provided with suitable insulating layers therebetween. Similarly, one or more stacked metallization layers with suitable insulating layers may be provided on top of one or both of the metallization patterns of the diffused connector, e.g. connector 11, of the present invention as it is obvious to those skilled in the art.

Thus, while the invention has been particularly shown and described with reference to the preferred embodiments, it will be understood by those skilled in the art that the foregoing and other changes in form and detail may be made therein without departing from the spirit and scope of the invention.

We claim:

1. Electrical connector apparatus for connecting at least first and second integrated circuit chips thereto, said apparatus comprising in combination:

a flat semiconductor substrate having first and second outer surfaces, said substrate comprising a nondiffused first region of a predetermined conductivity-type disposed therethrough between said surfaces and a plurality of diffused second regions of opposite conductivity-type formed and recessed within said first region and disposed therethrough between said surfaces;

first and second insulating layers disposed on said first and second surfaces, respectively, said first and second insulating layers having a corresponding plurality of first apertures therein for exposing said first surface at said diffused second regions, and said second insulating layer having a corresponding plurality of second apertures therein for exposing said second surface at said diffused second regions;

first metallization conductive pattern of flat conductors disposed on said first insulating layer, preselected first parts of said first conductive pattern being in intimate contacting relationship with the first surface exposed at said diffused second regions; and second metallization conductive pattern of flat conductors disposed on said second insulating layer, preselected second parts of said second conductive pattern being in intimate contacting relationship with the second surface exposed at said diffused second regions;

said diffused second regions providing exclusively electrical interconnections between said first and second patterns, each of said second regions having a substantially low resistivity characteristic, said first region having a substantially uniform first thickness between said surfaces, and each of said second regions having a second thickness between said surfaces, said second thickness being less than said first thickness, said first integrated circuit chip being electrically and mechanically interconnected within the recesses of preselected ones of said recessed second regions on said first surface, and said second integrated circuit chip being electrically and mechanically interconnected within the recesses of preselected ones of said recessed second regions on said second surface.